US010082591B1

(12) United States Patent
Olsson et al.

(10) Patent No.: US 10,082,591 B1
(45) Date of Patent: *Sep. 25, 2018

(54) MAGNETIC UTILITY LOCATOR DEVICES AND METHODS

(71) Applicant: SeeScan Inc., San Diego, CA (US)

(72) Inventors: Mark S. Olsson, La Jolla, CA (US); Ray Merewether, La Jolla, CA (US)

(73) Assignee: SEESCAN, INC., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/485,082

(22) Filed: Apr. 11, 2017

Related U.S. Application Data

(63) Continuation of application No. 14/733,810, filed on Jun. 8, 2015, now Pat. No. 9,632,202, which is a continuation of application No. 13/041,320, filed on Mar. 4, 2011, now Pat. No. 9,057,754.

(60) Provisional application No. 61/310,680, filed on Mar. 4, 2010.

(51) Int. Cl.
| | |
|---|---|
| *G01V 3/165* | (2006.01) |
| *G01B 7/26* | (2006.01) |
| *G01B 7/00* | (2006.01) |
| *G01V 3/08* | (2006.01) |
| *G01R 33/09* | (2006.01) |

(52) U.S. Cl.
CPC ............ *G01V 3/165* (2013.01); *G01B 7/003* (2013.01); *G01B 7/26* (2013.01); *G01V 3/08* (2013.01); *G01R 33/096* (2013.01)

(58) Field of Classification Search
CPC ................................. G01V 3/08; G01V 3/081
USPC ......................................................... 324/329
See application file for complete search history.

(56) References Cited

U.S. PATENT DOCUMENTS

| | | | | |
|---|---|---|---|---|
| 3,754,275 | A * | 8/1973 | Carter .................. | G01M 3/005 324/220 |
| 4,656,750 | A | 4/1987 | Pitt | |
| 5,417,112 | A * | 5/1995 | Rosenberg ............ | G01B 7/003 324/207.22 |
| 5,549,000 | A * | 8/1996 | Brown .................. | G01V 1/001 73/587 |
| 5,748,147 | A * | 5/1998 | Bickley ................ | G01S 5/0027 342/357.59 |
| 5,825,298 | A | 10/1998 | Walter | |
| 6,243,657 | B1 * | 6/2001 | Tuck .................. | G01N 29/2412 324/207.13 |

(Continued)

OTHER PUBLICATIONS

Czipott, Peter V., "Stand-off Detection and Tracking of Concealed Weapons Using Magnetic Tensor Tracking," Final Activities Report, Jun. 2001, Cover Page-p. 17, Quantum Magnetics, San Diego, USA.

(Continued)

*Primary Examiner* — Christopher McAndrew
(74) *Attorney, Agent, or Firm* — Steven C. Tietsworth, Esq.

(57) ABSTRACT

Magnetic locators for detection of buried objects, such as buried utilities of conductive materials, are disclosed. Outputs provided from two or more magnetic sensors, such as three three-axis magnetic sensors, as well as optionally from other sensors, such as accelerometers and gyroscopic sensors, may be used to determine magnetic field distortion and provide output information corresponding to the detected objects based on the sensor outputs.

19 Claims, 8 Drawing Sheets

(56) References Cited

U.S. PATENT DOCUMENTS

| | | | | |
|---|---|---|---|---|
| 6,553,322 | B1* | 4/2003 | Ignagni | F16L 55/48 701/32.4 |
| 7,222,549 | B2* | 5/2007 | Abney | F16L 55/48 73/865.9 |
| 7,443,154 | B1 | 10/2008 | Merewether | |
| 8,261,623 | B2* | 9/2012 | Miller | F16L 55/48 73/865.8 |
| 9,057,754 | B2* | 6/2015 | Olsson | G01R 33/10 |
| 9,632,202 | B2* | 4/2017 | Olsson | G01R 33/10 |
| 2005/0156600 | A1* | 7/2005 | Olsson | G01S 7/03 324/329 |

OTHER PUBLICATIONS

Kvitkovic, J. et al, "Three-Axis Cryogenic Hall Sensor," Journal of Magnetism and Magnetic Materials, 1996, pp. 440-441, Institute of Electrical Engineering, Slovak Academy of Sciences, Bratislava, Slovak Republic/Slovakia.

Li, X. et al, "Application of AMR Sensors to Vehicle Detection," Journal of University of Science and Technology Beijing, 2006, vol. 28, Issue 6, Beijing, China/P.R. China.

Paasia, Jaakko et al, "Homogeneity Studies of Multifilamentary BSCCO Tapes by Three-Axia Hall Sensor Magnetometry," IEEE Transactions on Applied Superconductivity, 199-June, pp. 1598-1601, vol. 9, No. 2, Laboratory of Electricity and Magnetism, Tampere University of Technology, Tampere, Finland.

Wynn, W. Michael, "Detection, Localization, and Characterization of Static Magnetic-Dipole Sources," Detection and Identification of Visually Obscured Targets, 1999, pp. 337-374, Taylor & Francis, USA.

* cited by examiner

MAGNETIC UTILITY LOCATOR DEVICES AND METHODS

CROSS-REFERENCE TO RELATED APPLICATION

This application is a continuation of and claims priority to U.S. Utility patent application Ser. No. 14/733,810, filed Jun. 8, 2015, entitled ECONOMICAL MAGNETIC LOCATOR APPARATUS AND METHODS, to issue as U.S. Pat. No. 9,632,202 on Apr. 25, 2017, which is a continuation of and claims priority to U.S. Utility patent application Ser. No. 13/041,320, filed Mar. 4, 2011, entitled ECONOMIC MAGNETIC LOCATOR APPARATUS AND METHOD, now U.S. Pat. No. 9,057,754, issued on Jun. 16, 2015, which claims priority to U.S. Provisional Patent Application Ser. No. 61/310,680, entitled ECONOMICAL MAGNETIC LOCATOR, filed Mar. 4, 2010. The content of each of these applications is hereby incorporated by reference herein in its entirety for all purposes.

FIELD OF THE INVENTION

This invention relates generally to magnetic locators. More specifically, but not exclusively, the invention relates to magnetic locators used for detecting ferromagnetic objects in the environment that are buried or obscured from plain sight.

BACKGROUND

Magnetic locators used for detecting ferromagnetic objects that are buried or obscured from plain sight are known in the art. These magnetic locators are often employed in industrial or construction sites to detect ferromagnetic objects, such as Parker-Kalon (PK) nails, iron pipes, buried metal objects, valve covers, masonry nails, manhole covers, wires, cast iron water and gas lines, valve boxes, septic tanks and well casings, and surveyor markers.

Conventional magnetic locators, however, leave much room for improvement. Current magnetic locators are often costly to both the manufacturer and the customer, are unduly complex in configuration, and have variable sensitivity. For example, conventional magnetic locators often require manual orientation to a north pole, and need to be carried close to the ground in order to generate accurate readings. Conventional magnetic locators often employ elements such as a dipping needle, an LCD, or audible tones, to indicate the presence of ferromagnetic objects. Such conventional magnetic locators also employ flux-gate magnetic field sensors, such as single-core and double-core (e.g., Förster and Vaquier type sensors), where the odd harmonics of the magnetizing current in the output signal are heavily attenuated.

Accordingly, there is a need for improved magnetic locators that enable reduction in manufacturing cost, provide improved sensitivity, and/or provide other enhanced functionality.

SUMMARY

The present invention relates generally to cost-efficient, robust magnetic locators, as well as methods of using such locators.

For example, in accordance with one aspect, the present invention relates to a magnetic locator apparatus. The magnetic locator may include a body, a three-axis magnetic sensing module, a printed circuit board or other module configured to receive and process sensor signals, and a display circuit or display module configured to generate and/or control output information, which may include visual displays. The magnetic locator may further include an output module, which may be configured to provide audible and/or visual output information in conjunction with the display circuit and/or other circuits or modules.

In another aspect, the invention relates to a method of locating a ferromagnetic object with a magnetic locator. The method may include, for example, determining the difference in B-field angles sensed by a plurality of magnetic sensor devices of a magnetic locator, enhancing the accuracy of calculated bearings to a ferromagnetic object using the input from an embedded accelerometer, enhancing the accuracy of calculated bearings to a ferromagnetic object using the input from a gyroscopic integrated circuit device, and providing a dynamic display of bearing toward a ferromagnetic object by processing inputs from a plurality of sensors, such as magnetoresistive sensors, in real-time.

In another aspect, the present invention relates to a magnetic locator device for sensing an object, such as a ferromagnetic object. The magnetic locator device may include, for example, a housing element, a first magnetic sensor device, such as a three-axis magnetic sensor device, disposed in the housing element, a second magnetic sensor device disposed in the housing element, wherein the second magnetic sensor device is positioned above the first magnetic sensor device in the staff element when the staff element is in a vertical orientation, and a circuit board module coupled to the first magnetic sensor device and the second magnetic sensor device, wherein the circuit board module is configured to compare output signals from the first magnetic sensor device and the second magnetic sensor device so as to determine a magnetic field distortion caused by a ferromagnetic object. The output from the first magnetic sensor device may include multiple outputs which may correspond to multiple axes, one or more of which may be compared to one or more outputs of the second magnetic sensor device to determine the magnetic field distortion. The determining magnetic field distortion may include, for example, determining the difference in B-field angles sensed by the first magnetic sensor device and the second magnetic sensor device.

In another aspect, the present invention relates to a method of magnetically sensing or locating an object, such as a ferromagnetic object. The method may include, for example, generating a first output signal from a first magnetic sensor device, which may be a three-axis magnetic sensor device, disposed in a housing element, generating a second output signal from a second magnetic sensor device, which may also be a three-axis magnetic sensor device, disposed in the housing element, wherein the second magnetic sensor device is positioned above the first magnetic sensor device when the housing element is in a vertical orientation, generating a signal corresponding to a magnetic field distortion caused by the object by comparing the first output signal and second output signal, and providing an output corresponding to the object based at least in part on the magnetic field distortion signal. The output from the first magnetic sensor device may include multiple outputs which may correspond to multiple axes, one or more of which may be compared to one or more outputs of the second magnetic sensor device to determine the magnetic field distortion. The determining magnetic field distortion may include, for example, determining the difference in B-field angles sensed by the first magnetic sensor device and the second magnetic sensor device.

In another aspect, the present invention relates to a magnetic locator device for locating objects, such as ferromagnetic objects. The device may include, for example, a housing element, a first sensor module comprising a plurality of magnetic sensor devices disposed in the housing element, a second sensor module comprising a magnetic sensor device disposed in the housing element, wherein the second sensor module is positioned above the first sensor module in the housing element when the shaft element is in a vertical orientation, and a circuit board module coupled to the first sensor module and the second sensor module, wherein the circuit board module is configured to compare output signals from the first sensor module and the second sensor module so as to determine a magnetic field distortion caused by a ferromagnetic object. The outputs from the first plurality of magnetic sensor devices of the first module may include multiple outputs which may correspond to multiple axes, one or more of which may be compared to one or more outputs of the second magnetic sensor device of the second module to determine the magnetic field distortion. The determining magnetic field distortion may include, for example, determining the difference in B-field angles sensed by the first magnetic sensor devices and the second magnetic sensor device.

In another aspect, the present invention relates to a method of magnetically sensing an object. The method may include, for example, generating a first output signal from a first sensor module comprising a plurality of magnetic sensor devices disposed in a housing element, generating a second output signal from a second sensor module comprising a magnetic sensor device disposed in the housing element, wherein the second sensor module is positioned above the first sensor module in the housing element when the housing element is in a vertical orientation, generating a signal corresponding to a magnetic field distortion caused by the object by comparing the first output signal and second output signal, and providing an output corresponding to the object based at least in part on the magnetic field distortion signal. The outputs from the first plurality of magnetic sensor devices of the first sensor module may include multiple outputs which may correspond to multiple axes, one or more of which may be compared to one or more outputs of the second magnetic sensor device of the second module to determine the magnetic field distortion. The determining magnetic field distortion may include, for example, determining the difference in B-field angles sensed by the first magnetic sensor devices and the second magnetic sensor device.

In another aspect, the present invention relates to computer readable media containing instructions for causing a processor to perform the above-described methods, in whole or in part.

In another aspect, the present invention relates to a locator apparatus comprising means to perform the above-described methods, in whole or in part.

Various additional aspects, features, and functions are described below in conjunction with the appended Drawings.

BRIEF DESCRIPTION OF THE DRAWINGS

The present application may be more fully appreciated in connection with the following detailed description taken in conjunction with the accompanying drawings, wherein.

DETAILED DESCRIPTION

Overview

The present invention relates generally to magnetic locators, locator apparatus, and methods for locating buried objects. More specifically, but not exclusively, the invention relates to magnetic locator devices that may be used for detecting ferromagnetic objects in the environment that are buried or obscured from plain sight. The following exemplary embodiments are provided for the purpose of illustrating examples of various aspects, details, and functions of the present invention; however, the described embodiments are not intended to be in any way limiting. It will be apparent to one of ordinary skill in the art that various aspects may be implemented in other embodiments within the spirit and scope of the present invention.

For example, in one aspect, the present invention relates to a magnetic locator device for sensing an object, such as a ferromagnetic object. The magnetic locator device may include, for example, a housing element, a first magnetic sensor device, such as a three-axis magnetic sensor device, disposed in the housing element, a second magnetic sensor device disposed in the housing element, wherein the second magnetic sensor device is positioned above the first magnetic sensor device in the staff element when the staff element is in a vertical orientation, and a circuit board module coupled to the first magnetic sensor device and the second magnetic sensor device, wherein the circuit board module is configured to compare output signals from the first magnetic sensor device and the second magnetic sensor device so as to determine a magnetic field distortion caused by a ferromagnetic object. The output from the first magnetic sensor device may include multiple outputs which may correspond to multiple axes, one or more of which may be compared to one or more outputs of the second magnetic sensor device to determine the magnetic field distortion. The determining magnetic field distortion may include, for example, determining the difference in B-field angles sensed by the first magnetic sensor device and the second magnetic sensor device.

The first and second magnetic sensor devices may be, for example, anisotropic magnetoresistive (AMR) sensor devices. An output of the second magnetic sensor device may include a reference signal for computing magnetic field variations determined based on an output of the first magnetic sensor device.

The locator device may further include, for example, an output element, wherein the output element is configured to provide an output associated with the ferromagnetic object based at least in part on the determined magnetic field variation. The output element may include an audible and/or visual indicator device or component. The output may correspond to a bearing to the ferromagnetic object. Alternately, or in addition, the output may correspond to a position or location or distance of the ferromagnetic object and/or a motion or tracking direction associated with movement relative to the object.

The output element may include, for example, an audible indicator element disposed to provide an audible output corresponding to the ferromagnetic object. Alternately, or in addition, the output element may include a visual display element. The device may further include a display circuit component configured to receive a signal corresponding to or associated with the determined magnetic field distortion and generate a signal to control a visual display associated with the ferromagnetic object, based at least in part on the magnetic field distortion, on the display element. The visual display may include a bearing or other location or position indication corresponding with the object, such as a bearing to the object.

The locator device may be configured, for example, so that the first magnetic sensor device and the second magnetic sensor device may be calibrated such that the measured B-field magnitudes from the first magnetic sensor device and the second magnetic sensor devices are matched in one or more magnetic field directions. The output signals from the first magnetic sensor device and second magnetic sensor device may be coupled through a filter circuit to normalize the output signals, such as before providing the outputs to a printed circuit board or other circuit element. The filter circuit may include a differential op-amp circuit. The filter circuit may include a high-pass filter circuit. The filter circuit may include a Kalman filter circuit.

The locator device may further include an accelerometer device, and the output, such as an output provided on the visual display, may be further based in part on an output provided from the accelerometer device. Alternately, or in addition, the device may further include a gyroscopic device, and the output may be further based in part on an output from the gyroscopic device. The accelerometer and/or gyroscopic device may be disposed in the housing element.

In another aspect, the present invention relates to a method of magnetically sensing or locating an object, such as a ferromagnetic object. The method may include, for example, generating a first output signal from a first magnetic sensor device, which may be a three-axis magnetic sensor device, disposed in a housing element, generating a second output signal from a second magnetic sensor device, which may also be a three-axis magnetic sensor device, disposed in the housing element, wherein the second magnetic sensor device is positioned above the first magnetic sensor device when the housing element is in a vertical orientation, generating a signal corresponding to a magnetic field distortion caused by the object by comparing the first output signal and second output signal, and providing an output corresponding to the object based at least in part on the magnetic field distortion signal. The output from the first magnetic sensor device may include multiple outputs which may correspond to multiple axes, one or more of which may be compared to one or more outputs of the second magnetic sensor device to determine the magnetic field distortion. The determining magnetic field distortion may include, for example, determining the difference in B-field angles sensed by the first magnetic sensor device and the second magnetic sensor device.

The first and second magnetic sensor devices may include, for example, anisotropic magnetoresistive (AMR) sensor devices. The output may be an audible output associated with detection of the ferromagnetic object. Alternately, or in addition, the output may be provided on a display device. The output may correspond to a visual representation associated with the ferromagnetic object based at least in part on the magnetic field distortion signal. For example, the output may correspond to a bearing to the ferromagnetic object or a position, location, and/or movement relative to the object. An output of the second magnetic sensor device may comprise a reference signal for computing magnetic field variations determined based on an output of the first magnetic sensor device.

The method may further include, for example, calibrating the first magnetic sensor device and the second magnetic sensor device such that the measured B-field magnitudes from the first magnetic sensor device and the second magnetic sensor device are matched in one or more magnetic field directions. The output signals from the first magnetic sensor device and second magnetic sensor device may be coupled through a filter circuit to normalize the output signals. The filter circuit may include a differential op-amp circuit. The filter circuit may include a high-pass filter element. The filter circuit may include a Kalman filter element.

The method may further include, for example, providing an accelerometer output from an accelerometer device. The output may be further based on the accelerometer output. The method may further include providing a gyroscopic output from a gyroscopic device. The output may be further based on the gyroscopic output. The accelerometer and/or gyroscopic device may be disposed in the housing.

In another aspect, the present invention relates to a magnetic locator device for locating objects, such as ferromagnetic objects. The device may include, for example, a housing element, a first sensor module comprising a plurality of magnetic sensor devices disposed in the housing element, a second sensor module comprising a magnetic sensor device disposed in the housing element, wherein the second sensor module is positioned above the first sensor module in the housing element when the shaft element is in a vertical orientation, and a circuit board module coupled to the first sensor module and the second sensor module, wherein the circuit board module is configured to compare output signals from the first sensor module and the second sensor module so as to determine a magnetic field distortion caused by a ferromagnetic object. The outputs from the first plurality of magnetic sensor devices of the first module may include multiple outputs which may correspond to multiple axes, one or more of which may be compared to one or more outputs of the second magnetic sensor device of the second module to determine the magnetic field distortion. The determining magnetic field distortion may include, for example, determining the difference in B-field angles sensed by the first magnetic sensor devices and the second magnetic sensor device.

The magnetic sensor devices may include, for example, anisotropic magnetoresistive (AMR) sensor devices. Alternately, or in addition, the magnetic sensor devices may include three-axis sensor devices. The plurality of magnetic sensor devices may include three magnetic sensor devices positioned substantially equidistantly around the interior of the shaft element. An output of the second sensor module may include a reference signal for computing magnetic field variations determined based on an output of the first sensor module.

The device may further include, for example, an output element. The output element may be configured so as to provide an output associated with the ferromagnetic object based at least in part on the determined magnetic field variation. The output element may include an audible indicator element disposed to provide an audible output associated with the ferromagnetic object. Alternately, or in addition, the output element may include a display device or element. The device may further include a display circuit component configured to receive a signal corresponding to the determined magnetic field distortion and generate a signal to control an output display associated with the ferromagnetic object, based at least in part on the magnetic field distortion, on the display element. The display circuit component may be integral with or coupled with a printed circuit board module or component. The output display may include a visual indication of a bearing to the ferromagnetic object and or a distance, location, and/or movement relative to the object.

The device may be configured, for example, so that the first sensor module and the second sensor module may be calibrated such that the measured B-field magnitudes are matched in one or more field directions. The output signals from the first sensor module and second sensor module may be coupled through a filter circuit to normalize the output signals. The filter circuit may include a differential op-amp circuit. The filter circuit may include a high-pass filter circuit. The filter circuit may include a Kalman filter circuit.

The device may further include, for example, an accelerometer device. The output may be further based in part on an output signal provided from the accelerometer device. Alternately, or in addition, the device may include a gyroscopic device. The output may be further based in part on an output from the gyroscopic device. The accelerometer and/or gyroscopic device may be disposed in the housing element.

In another aspect, the present invention relates to a method of magnetically sensing an object, such as a ferromagnetic object. The method may include, for example, generating a first output signal from a first sensor module comprising a plurality of magnetic sensor devices disposed in a housing element, generating a second output signal from a second sensor module comprising a magnetic sensor device disposed in the housing element, wherein the second sensor module is positioned above the first sensor module in the housing element when the housing element is in a vertical orientation, generating a signal corresponding to a magnetic field distortion caused by the object by comparing the first output signal and second output signal, and providing an output corresponding to the object based at least in part on the magnetic field distortion signal. The outputs from the first plurality of magnetic sensor devices of the first sensor module may include multiple outputs which may correspond to multiple axes, one or more of which may be compared to one or more outputs of the second magnetic sensor device of the second module to determine the magnetic field distortion. The determining magnetic field distortion may include, for example, determining the difference in B-field angles sensed by the first magnetic sensor devices and the second magnetic sensor device.

The magnetic sensor devices may include, for example, anisotropic magnetoresistive (AMR) sensor devices. Alternately, or in addition, the magnetic sensor devices may include three-axis sensor devices. The plurality of magnetic sensor devices may include three magnetic sensor devices positioned substantially equidistantly around the interior of the shaft element.

The output may be, for example, an audible output associated with the ferromagnetic object. Alternately, or in addition, the output may be provided on a display device. The output may correspond to a visual representation associated with the ferromagnetic object based at least in part on the magnetic field distortion signal. The output display may include a visual indication of a bearing to the ferromagnetic object or a distance, location, and/or movement relative to the object. The output of the second sensor module may include a reference signal for computing magnetic field variations determined based on the output of the first sensor module.

The method may further include, for example, calibrating the first sensor module and the second sensor module such that the measured B-field magnitudes from the first sensor module and the second sensor module are matched in one or more field directions.

The output signals from the first sensor module and second sensor module may, for example, be coupled through a filter circuit to normalize the output signals. The filter circuit may include a differential op-amp circuit. The filter circuit may include a high-pass filter circuit. The filter circuit may include a Kalman filter circuit.

The method may further include, for example, providing an accelerometer output from an accelerometer device. The output may be further based at least in part on the accelerometer output. Alternately, or in addition, the method may further include providing a gyroscopic output from a gyroscopic device. The output may be further based in part on the gyroscopic output. The accelerometer and/or gyroscopic devices may be disposed in the housing.

In another aspect, the present invention relates to a computer-readable medium containing instructions for causing a processor to control a method including generating a first output signal from a first magnetic sensor device, which may be a three-axis magnetic sensor device, disposed in a housing element, generating a second output signal from a second magnetic sensor device, which may be a three-axis magnetic sensor device, disposed in the housing element, wherein the second magnetic sensor device is positioned above the first magnetic sensor device when the housing element is in a vertical orientation, generating a signal corresponding to a magnetic field distortion caused by the object by comparing the first output signal and second output signal, and providing an output corresponding to the object based at least in part on the magnetic field distortion signal.

In another aspect, the present invention relates to a computer-readable medium containing instructions for causing a processor to control a method including generating a first output signal from a first sensor module comprising a plurality of magnetic sensor devices disposed in a housing element, generating a second output signal from a second sensor module comprising a magnetic sensor device disposed in the housing element, wherein the second sensor module is positioned above the first sensor module in the housing element when the housing element is in a vertical orientation, generating a signal corresponding to a magnetic field distortion caused by the object by comparing the first output signal and second output signal, and providing an output corresponding to the object based at least in part on the magnetic field distortion signal.

Various additional aspects, features, and functions are described below in conjunction with FIGS. 1 through 8 of the appended Drawings.

It is noted that as used herein, the term, "exemplary" means "serving as an example, instance, or illustration." Any aspect, detail, function, implementation, and/or embodiment described herein as "exemplary" is not necessarily to be construed as preferred or advantageous over other aspects and/or embodiments.

Example Embodiments

Figure 1:
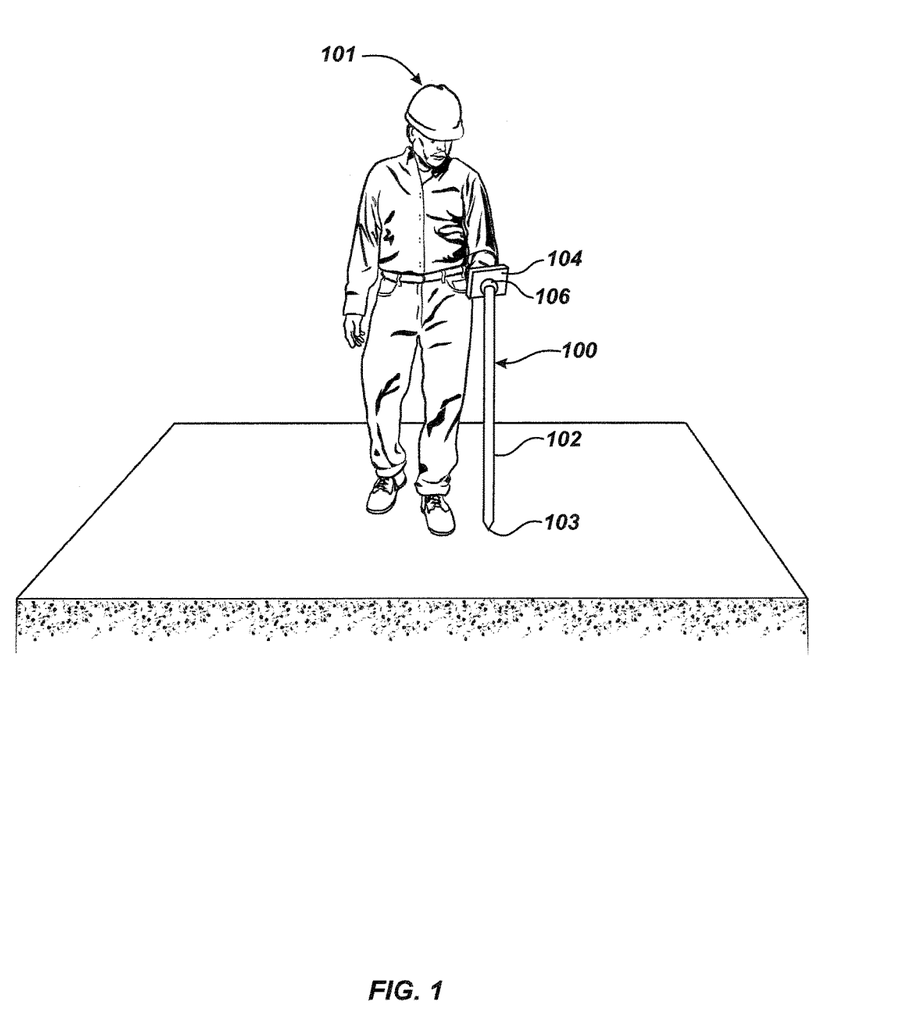
FIG. 1 is an isometric view of an embodiment of a magnetic locator in a stand-alone configuration.

Turning to FIG. 1, various details of one embodiment of a magnetic locator 100 in accordance with aspects of the present invention are illustrated. FIGS. 2 through 6 illustrate additional embodiments of the interior construction of a magnetic locator, which may correspond with a lower portion of housing 102 as illustrated in FIG. 1.

As shown in FIG. 1, the magnetic locator 100 may be gripped in one hand by a user 101, and the configuration may include a housing element 102, a tapered point 103, and an output audio and/or visual display element 104, which may be configured to rotate on a connecting joint 106. A battery compartment and/or recharging circuit, not shown, may optionally be built into the housing 102, as well as other components as are known or developed in the art (not shown for clarity).

FIGS. 2 through 6 illustrate embodiments of details of magnetic locators in accordance with various aspects, which may correspond with details and/or components of locator 100 of FIG. 1, as well as example interior constructions thereof.

Figure 2:
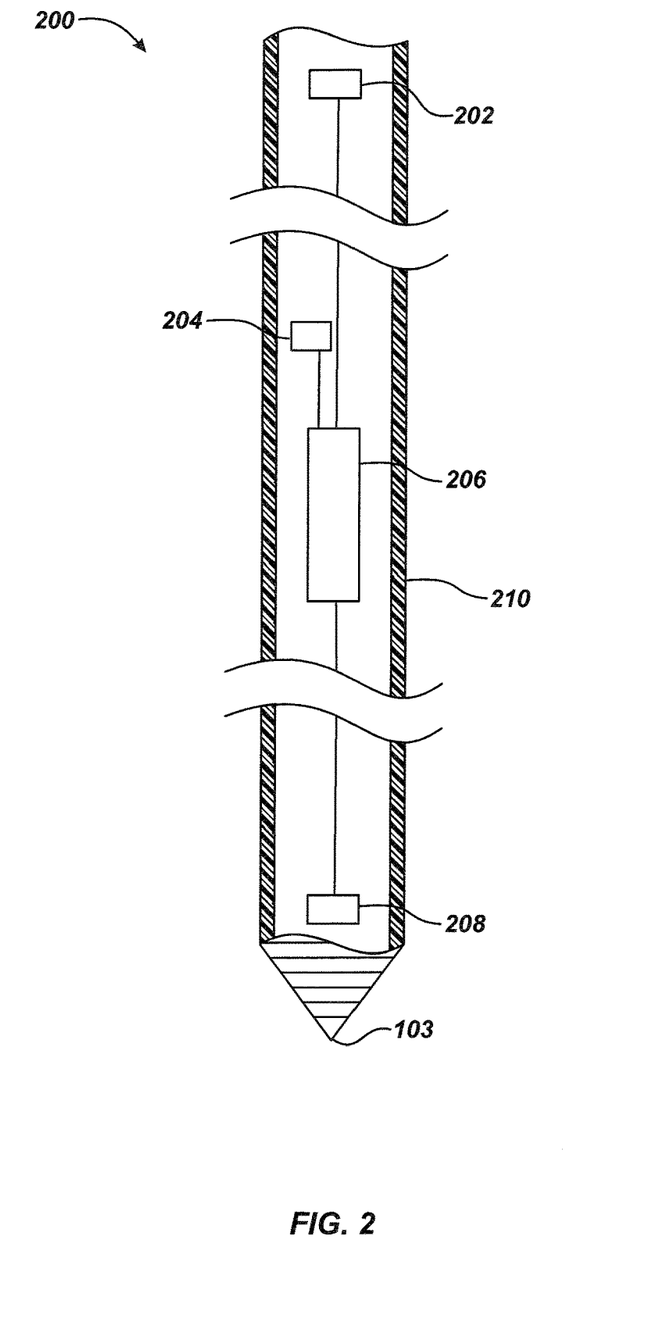
FIG. 2 is a cutaway view of the interior construction of the magnetic locator having three-axis magnetic sensors.

For example, the embodiment of FIG. 2 illustrates aspects of one embodiment of construction of a lower housing element 200, which may correspond with a lower portion of housing 102 as shown in FIG. 1, and may include elements such as an outer casing 210, and a Printed Circuit Board (PCB) module 206, which may be used to receive and process signals received from magnetic sensor devices and/or other sensors (such as accelerometers, gyroscopic sensors, GPS devices, or other sensing elements), process the signals to detect conditions, such as magnetic field distortions, that may be associated with sensed objects, and control or govern output of audible and/or visual information corresponding to the sensed objects. For example, the output may be an audible tone and/or a visual display, such as may be provided on output element 104 as shown in FIG. 1. Audible output may be provided from output element 104 from, for example, a speaker, buzzer, piezoelectric device, and/or via other audio output devices (not shown). Visual output may be provided, for example, from a visual display device component of output element 104, such as an LCD or other visual display element.

In order to provide visual output, a display circuit component 202 may be integral with or coupled to PCB module 206. Display circuit component 202 may comprise an electronic circuit module or integrated circuit device configured to control output on a display device, such as by generating a display and/or controlling an LCD panel, etc.

PCB module 206 may include analog and/or digital electronic components, optical components, programmable devices, processors, memory, and/or other components such as are known or developed in the art to facilitate receipt of analog or digital signals such as from sensor devices, perform analog to digital conversion on received signals, process received signals to detect buried objects, store data associated with detected objects, as well as provide output signals to provide audible and/or visual indication of detected objects as well as position and/or movement associated with location of the buried object and/or tracking of the buried object. For example, PCB module 206 may include a circuit configured to receive outputs from multiple magnetic sensor devices, such as three-axis magnetic sensors, and compare the outputs to determine the magnetic field distortion. The determining magnetic field distortion may include, for example, determining the difference in B-field angles sensed by the first magnetic sensor device and the second magnetic sensor device. In implementations where only two vertically separated single-axis sensors are used (e.g., magnetic gradiometers), information associated with magnetic field perturbations caused by a ferrous object is limited. By measuring magnetic field vectors in multiple axes using separate sensors, additional information regarding magnetic field perturbations or distortions caused by the sensed object may be determined, such as determining whether or not magnetic field vectors measured by separated sensors are parallel or not.

To provide magnetic sensor signals, a first magnetic sensor device 208, which in an exemplary embodiment is a three-axis magnetic sensor device, and a second magnetic sensor device 204, which may also be a three-axis magnetic sensor device, may be disposed in the lower housing 200, and may be coupled either directly or through other circuits, such as, for example, through filters or other signal processing circuits, to PCB module 206. In an exemplary embodiment, the second magnetic sensor device 204 may be positioned in the lower housing 200 such that it is above the first magnetic sensor device 208 when the housing 102 is a vertical or substantially vertical position, such as when being used as shown in FIG. 1. The magnetic sensor devices may be, for example, anisotropic magnetoresistive (AMR) sensors.

The second magnetic sensor device 204 may serve as a reference source for computing magnetic directionality based on field variation detected by the first magnetic sensor device 208, with processing elements of PCB module 206 configured to perform processing on received signals so as to detect location of buried objects. Distortions to the magnetic field caused by objects, such as ferromagnetic objects, may be determined in multiple dimensions.

The first magnetic sensor device 208 and the second magnetic sensor device 204 may be calibrated so that the B-field angles as measured in a neutral environment, and the measured B magnitudes, are matched in one or more (typically in all) field directions. This may be used to normalize data generated by the first magnetic sensor device 208 and the second magnetic sensor device 204 under dynamic field conditions. In an alternate implementation, a comparable normalization may also be achieved by transferring such data through a differential op-amp circuit and imposing a high-pass or a band-pass filter, such as a Kalman band-pass filter at an appropriate frequency, such as at 0.1 Hz.

Processing of the received magnetic sensor signals may include comparison of outputs of the first magnetic sensor device 208 and the second magnetic sensor device 204 to reveal field distortions, which may in turn provide a bearing or other position indicator or reference signal relative to a buried ferromagnetic object. In an exemplary embodiment using a three-axis magnetic sensor chip, the three-axis magnetic sensor chip's properties may cause it to change resistance by 2%-3% in the presence of a magnetic field.

Figure 3:
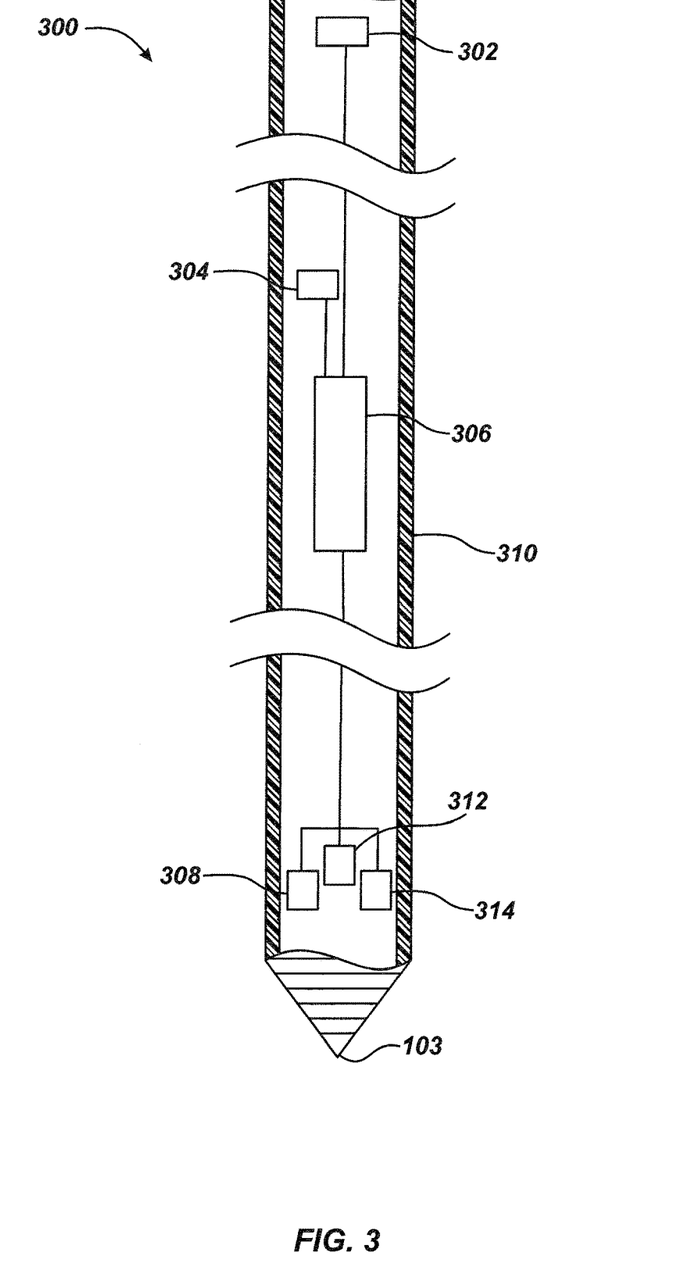
FIG. 3 is a cutaway view of the interior construction of another embodiment of a magnetic locator employing a plurality of magnetic sensors.

FIG. 3 illustrates details of another embodiment of a lower housing 300, which may correspond with a lower portion of housing 102 as shown in FIG. 1, wherein multiple magnetic sensor devices (which may, in an exemplary embodiment, also be three-axis magnetic sensors) may be used. In this embodiment, the resolution of a calculated target bearing may be enhanced through the use of more than one three-axis magnetic sensor.

Lower housing 300 may include, for example, elements such as an outer casing 310, which may correspond with outer casing 210 shown in FIG. 2, and a plurality of magnetic sensor devices 308, 312, and 314 (which may also be denoted as lower magnetic sensor devices or lower magnetic sensors), which may be three-axis magnetic sensors and which may be mounted equidistantly around the interior of lower housing 300. The plurality of magnetic sensor devices 308, 312, and 314 may be viewed collectively as a sensor module. In alternate embodiments, other numbers and/or configurations of sensors may be also be used.

A PCB module 306 may be coupled to a plurality of magnetic sensor devices 308, 312, and 314 and another magnetic sensor device 304, which may be denoted as an upper magnetic sensor or sensor module. PCB module 306 may be configured similarly to module 206 of FIG. 2, while also having the capability of processing signals from multiple lower magnetic sensor elements in the lower sensor module (e.g., magnetic sensor devices 308, 312, and 314), rather than from a single multi-axis lower magnetic sensor device, such as shown in FIG. 2. Use of multiple sensors at the lower end of lower housing 300, such as magnetic sensor devices 308, 312, and 314, may enable a finer resolution in determining the calculated bearing toward a ferromagnetic object.

A display circuit component 302, which may correspond with display circuit component 202 as shown in FIG. 2, may be used to correlate the output of a processing circuit built into the PCB module 306 so as to build a visual display array, which may be rendered on a display device, such as an LCD or other display element of output device 104 as shown in FIG. 1.

The display circuit component 302 may correspond with the display circuit component 202 shown in FIG. 2. Upper magnetic sensor device 304, which in an exemplary embodiment may be a three-axis magnetic sensor, may correspond to the second magnetic sensor device 204 shown in FIG. 2.

Figure 4:
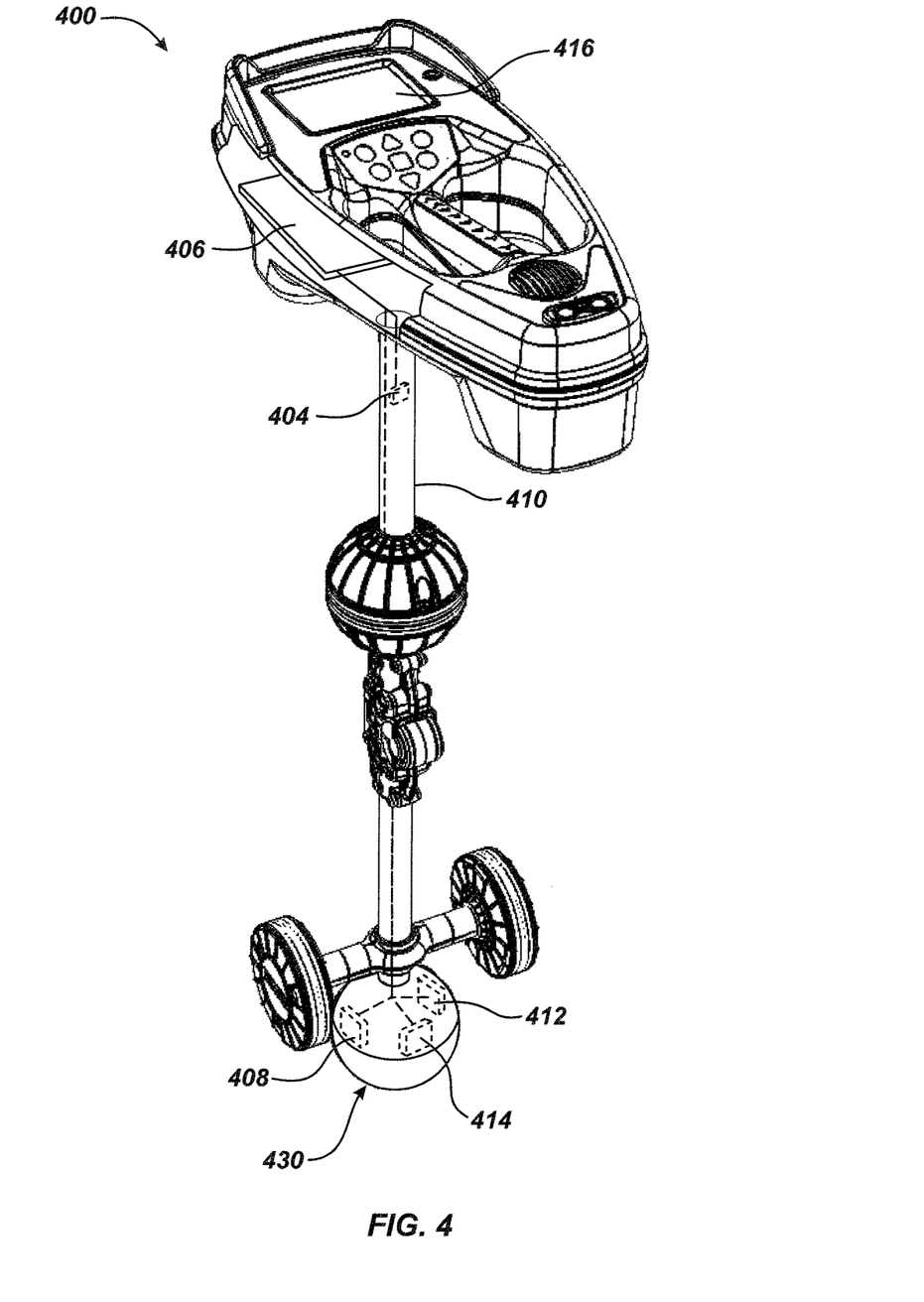
FIG. 4 is an isometric view of an embodiment of a magnetic locator apparatus embedded in a utility locator device.

FIG. 4 illustrates another embodiment of a magnetic locator 400, which may correspond to an embodiment of the locator 102 as shown in FIG. 1, and embodiments thereof, such as the lower housing element 300 shown in FIG. 3. Locator 400 may be coupled to a user interface device 416. In the illustrated implementation, a PCB module 406 integrates inputs provided from three lower magnetic sensor devices 408, 412, and 414, which may correspond to sensor devices 308, 312, and 314 of FIG. 3, and an input from an upper magnetic sensor device 404, which may correspond with the second magnetic sensor device 204 shown in FIG. 2 or the upper magnetic sensor device 304 of FIG. 3.

Output from PCB module 406 may be integrated into existing display circuitry of locator 400 and rendered on a locator display screen 416, which may correspond with output device 104 of FIG. 1. Lower magnetic sensor devices 408, 412, and 414 may be attached to the interior of a lower antenna ball 430 in this configuration, and connected by leads (not shown) running through the interior of a shaft 410 to PCB module 406.

The upper magnetic sensor device 404 may correspond to the second magnetic sensor device 204 shown in FIG. 2, and/or the upper magnetic sensor device 304 shown in FIG. 3. The PCB module 406 may correspond with PCB module 206 as shown in FIG. 2 and/or the PCB module 306 as shown in FIG. 3.

Figure 5:
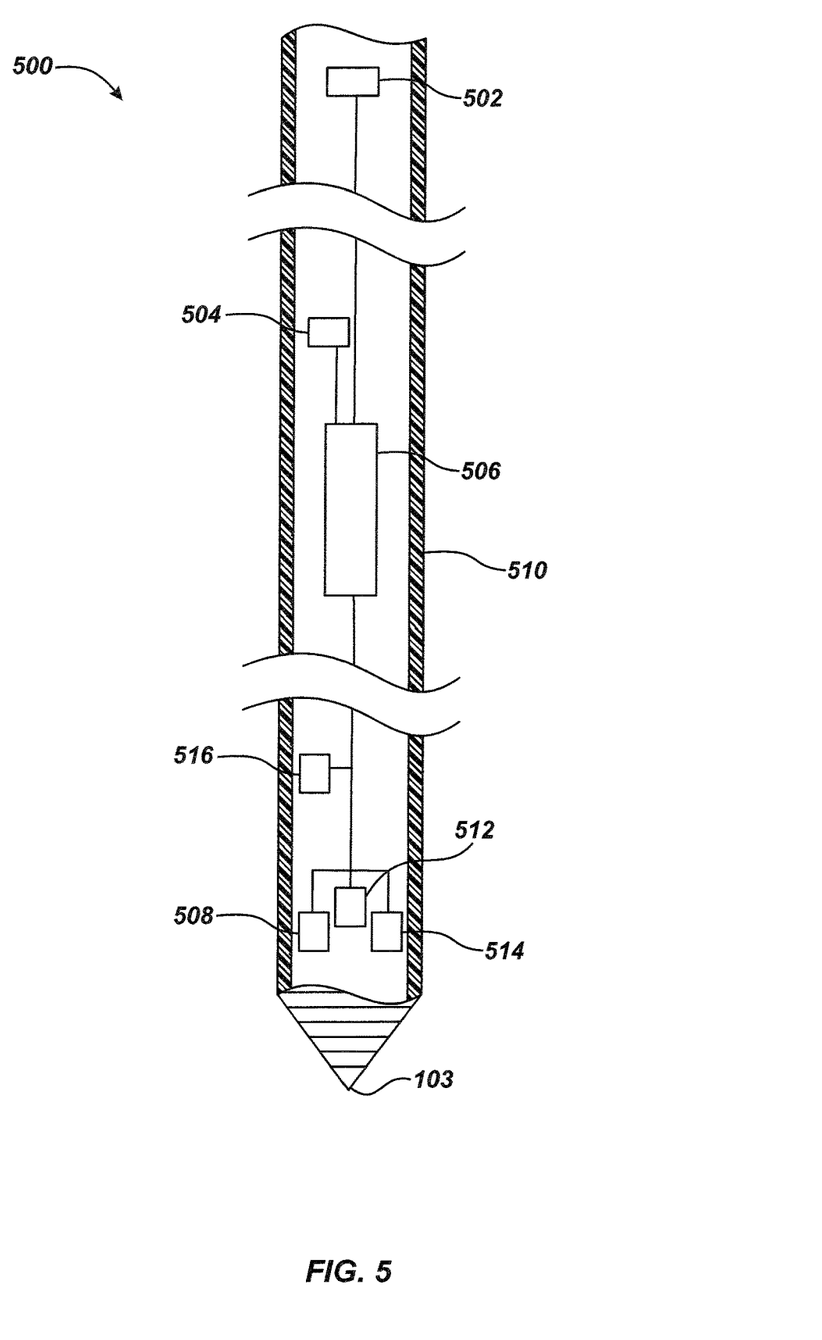
FIG. 5 is a cutaway view of an alternate embodiment of a magnetic locator apparatus employing a three-axis accelerometer.

In some embodiments, other sensors may be used to enhance the precision and accuracy of the detection of buried objects. For example, FIG. 5 illustrates aspects of an embodiment of a locator lower housing 500, which may correspond with a lower portion of housing 102 as shown in FIG. 1, and may use multiple magnetic sensor devices 508, 512 and 514 in the lower end of an outer casing 510 and an upper magnetic sensor device 504, which may correspond to sensor 304 of FIG. 3. The sensors may be, for example, multi-axis and/or AMR sensors.

Additionally, one or more accelerometers 516, such as, for example, a multi-axis accelerometer such as a three-axis accelerometer, may be used to provide a signal including a stream of data points by inertial sensing of the motion of the lower housing 500 as it is moved while searching for a ferromagnetic object. By including this data in calculations performed within a PCB module 506, in addition to determinations based on magnetic field distortion sensed by multiple sensors such as described previously, an estimation can be generated (e.g., based on the calculated motion of the magnetic sensor devices through an assumed uniform magnetic field) of the variation detected by the magnetic sensor devices in comparison.

For example, when this value is found to be above a predetermined threshold, the detection may be interpreted as the indication of a ferromagnetic target. This may be indicated as an output by, for example, a rise in audible tone as a function of the signal, or a visual display, or both, or through other output mechanisms known or developed in the art. A display circuit component 502 may be used to integrate input provided from PCB module 506 into a display array as, for example, is described previously herein.

In addition, in some embodiments a solid-state three-axis gyroscopic IC such as, for example, the InvenSense ITG-3200 single-chip MEMS gyroscope, can be used to provide gyroscopic signals to a printed circuit board (such as shown and described subsequently with respect to FIG. 6) to further enhance resolution of the calculated bearing to ferromagnetic objects. Output signals from the gyroscopic device may be combined with outputs provided from the multiple magnetic sensor devices and/or accelerometer device as described previously herein to generate an output corresponding with the sensed object.

The display circuit component 502 may correspond with the display circuit component 202 shown in FIG. 2 and/or the display circuit component 302 shown in FIG. 3. Upper magnetic sensor device 504 may correspond to the second magnetic sensor device 204 shown in FIG. 2, the upper three-axis magnetic sensor device 304 shown in FIG. 3, and/or the upper three-axis magnetic sensor device 404 shown in FIG. 4. The PCB module 506 may correspond with the PCB module 206 shown in FIG. 2, the PCB module 306 shown in FIG. 3, and/or the PCB module 406 shown in FIG. 4. The outer casing 510 may correspond to the outer casing 210 shown in FIG. 2 and/or the outer casing 310 shown in FIG. 3.

Figure 6:
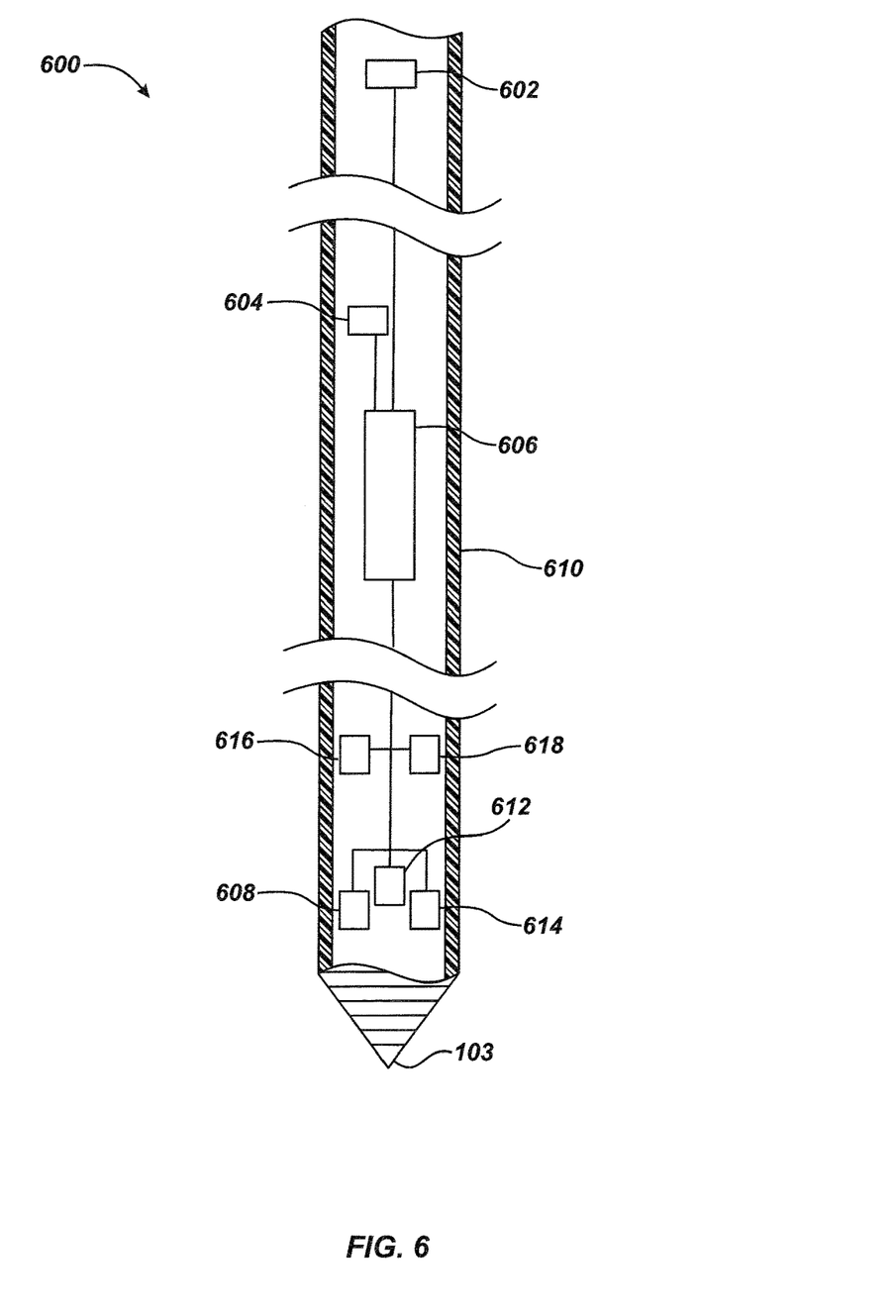
FIG. 6 is a cutaway view of an alternate embodiment of a magnetic locator apparatus employing a three-axis gyroscopic sensor.

FIG. 6 illustrates another embodiment of aspects of a locator wherein an accelerometer device and a gyroscopic device are included in a locator lower housing 600, which may correspond with a lower portion of housing 102 as shown in FIG. 1. The lower housing 600 may include lower magnetic sensors, such as magnetic sensors 608, 612, and 614 (or may include other numbers of sensors and/or configurations in alternate embodiments), along with a single upper sensor, such as a magnetic sensor 604, which may be mounted within outer housing 610 similarly to that described previously herein with respect to other embodiments. The upper and lower magnetic sensors may be three-axis sensors and/or AMR sensors.

The PCB module 606 may include analog and/or digital circuitry, including circuits to receiver, convert, and/or process signals received from the various sensors to provide positional and/or other information related to sensed objects, such as described previously herein. Accelerometer 616 and MEMs gyro IC 618 may be coupled to PCB module 606 and their output integrated into the computation of detection and bearing-resolution of ferromagnetic objects. The addition of signals provided from MEMs gyro IC 618 may be used to provide further correction for the rotation of the sensing array relative to the earth's magnetic field.

In processing the input data from the magnetic sensor devices a filtering element, such as a Kalman filter, for example, may be used. Where inertial sensors are used, their input may likewise be used with a Kalman filter to take advantage of the correlation between motion sensor input and magnetic sensor actual signals, and the non-correlation between noise in the inertial sensors and noise in the magnetic sensors. These properties can be used to process out noise and clarify the signal from the sensors, enhancing the sensitivity of object detection.

A display circuit component 602 may correspond with the display circuit component 202 shown in FIG. 2, the display circuit component 302 shown in FIG. 3, and/or the display circuit component 502 shown in FIG. 5. Upper magnetic sensor device 604 may correspond to the second magnetic sensor device 204 shown in FIG. 2, the upper three-axis magnetic sensor device 304 shown in FIG. 3, the upper three-axis magnetic sensor device 404 shown in FIG. 4, and/or the upper three-axis magnetic sensor device 504 shown in FIG. 5. The PCB module 606 may correspond with the PCB module 206 shown in FIG. 2, the PCB module 306 shown in FIG. 3, the PCB module 406 shown in FIG. 4, and/or the PCB module 506 shown in FIG. 5. The outer casing 610 may correspond to outer casing 210 shown in FIG. 2, the outer casing 310 shown in FIG. 3, and/or the outer casing 510 shown in FIG. 5.

Figure 7:
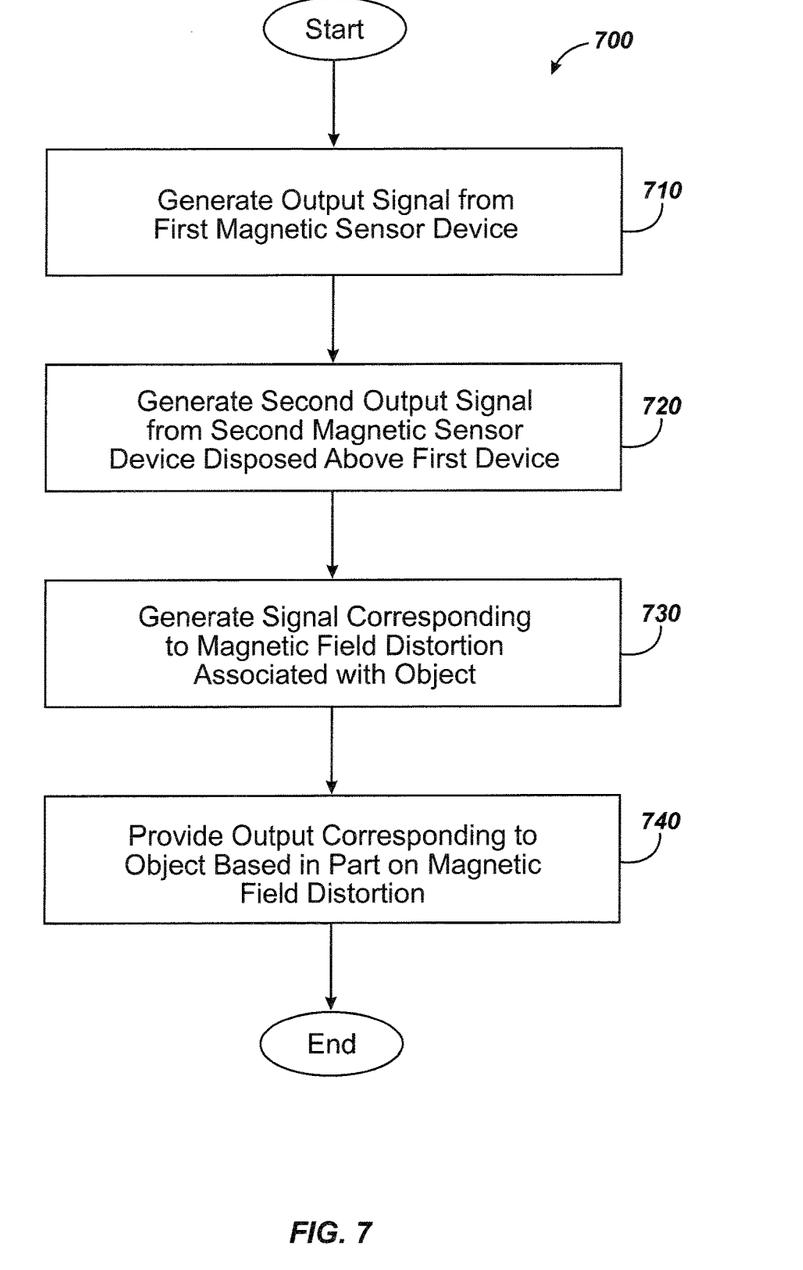
FIG. 7 is an embodiment of a method for locating an object using a magnetic locator apparatus having three-axis magnetic sensors.

FIG. 7 illustrates details of an embodiment of a process 700 for locating objects, such as buried ferromagnetic objects. The method may be implemented using a locator apparatus such as those described previously herein, such as in FIG. 2. At stage 710 a first output signal from a first magnetic sensor device, which in an exemplary embodiment may be a three-axis magnetic sensor disposed in a housing element, may be generated. At stage 720, a second output signal from a second magnetic sensor device, which may also be a three-axis magnetic sensor disposed in the housing element, may be generated. The second magnetic sensor device may be positioned above the first magnetic sensor device when the housing element is in a vertical orientation, such as shown in FIG. 1.

At stage 730, a signal corresponding to a magnetic field distortion caused by the object may be generated, with the signal generated at least in part by comparing the first output signal and second output signal. The first output signal and second output signal may include magnetic field components sensed in multiple directions or axes and/or from multiple positions. Signals from the multiple axes and/or positions may be compared to determine a magnetic field distortion associated with the object. The determining magnetic field distortion may include, for example, determining the difference in B-field angles sensed by multiple axes of the first magnetic sensor device and the second magnetic sensor device.

At stage 740, an output may be provided such as on an output element, which may correspond to the object. The output may be based at least in part on the determined magnetic field distortion.

The first and second magnetic sensor devices associated with process 700 may include, for example, anisotropic magnetoresistive (AMR) sensor devices. The first and second output signals may comprise multi-axis output signals associated with multiple directions and/or positions.

The output may be an audible output associated with detection of the object. Alternately, or in addition, the output may be provided on a display device. The output may correspond to a visual representation associated with the object based at least in part on the magnetic field distortion signal. For example, the output may correspond to a bearing to the ferromagnetic object or a position, location, and/or movement relative to the object. An output of the second magnetic sensor device may comprises a reference signal for computing magnetic field variations determined based on an output of the first magnetic sensor device.

The process 700 may further include, for example, calibrating the first magnetic sensor device and the second magnetic sensor device such that the measured B-field magnitudes from the outputs of the first magnetic sensor device and the second magnetic sensor device are matched in one or more magnetic field directions. The output signals from the first magnetic sensor device and second magnetic sensor device may be coupled through a filter circuit to normalize the output signals. The filter circuit may include a differential op-amp circuit. The filter circuit may include a high-pass filter element. The filter circuit may include a Kalman filter element.

The process 700 may further include, for example, providing an accelerometer output from an accelerometer device, which may be disposed in the housing. The output may be further based on the accelerometer output. The process may further include providing a gyroscopic output from a gyroscopic device, which may be disposed in the housing. The output may be further based on the gyroscopic output.

Figure 8:
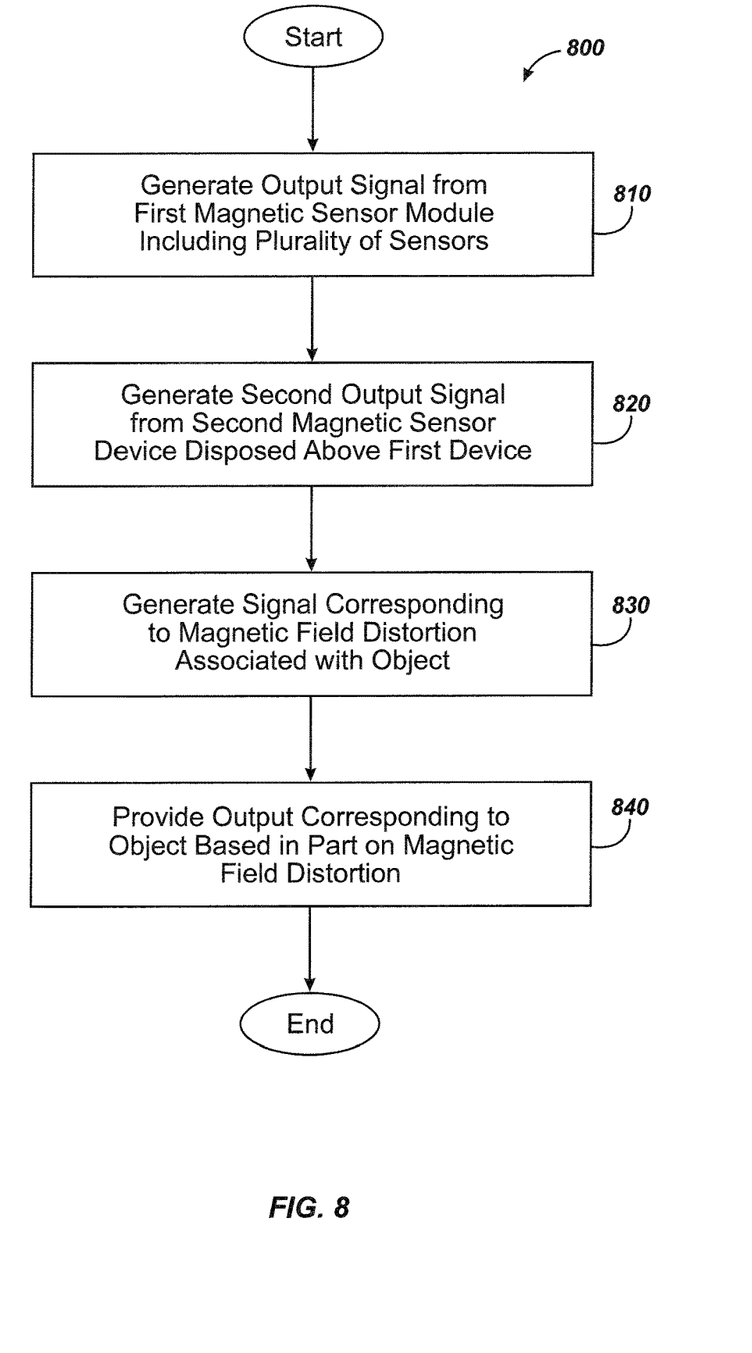
FIG. 8 is an embodiment of a method for locating an object using a magnetic locator apparatus having a plurality of magnetic sensors.

FIG. 8 illustrates details of another embodiment of a process 800 for locating objects, such as buried ferromagnetic objects. The method may be implemented using an apparatus having multiple lower magnetic sensing devices, such as those described previously herein in FIGS. 3-6. At stage 810, a first output signal may be generated from a first sensor module comprising a plurality of magnetic sensor devices, which may be three-axis magnetic sensor devices. The magnetic sensor devices may be disposed in a housing element. At stage 820, a second output signal from a second sensor module comprising a magnetic sensor device, which may also be a three-axis magnetic sensor device disposed in the housing element, may be generated. The second sensor module may be positioned above the first sensor module in the housing when the housing is in a vertical orientation, such as shown in FIG. 1.

At stage 830, a signal corresponding to a magnetic field distortion caused by the object may be generated. The signal may be generated by comparing the first output signal and second output signal. The first output signal and second output signal may include magnetic field components sensed in multiple directions or axes and/or from multiple positions.

Signals from the multiple axes and/or positions may be compared to determine a magnetic field distortion associated with the object. The determining magnetic field distortion may include, for example, determining the difference in B-field angles sensed by multiple axes of the first magnetic sensor device and the second magnetic sensor device.

At stage 840, an output may be provided such as on an output element, which may correspond to the sensed object. The output may be based at least in part on the determined magnetic field distortion signal.

The magnetic sensor devices associated with process 800 may include, for example, anisotropic magnetoresistive (AMR) sensor devices. Alternately, or in addition, the magnetic sensor devices may include three-axis magnetic sensor devices. The plurality of magnetic sensor devices may include three magnetic sensor devices positioned substantially equidistantly around the interior of the shaft element.

The output may be, for example, an audible output associated with the ferromagnetic object. Alternately, or in addition, the output may be provided on a display device. The output may correspond to a visual representation associated with the ferromagnetic object based at least in part on the magnetic field distortion signal. The output display may include a visual indication of a bearing to the ferromagnetic object or a distance, location, and/or movement relative to the object. The output of the second sensor module may include a reference signal for computing magnetic field variations determined based on the output of the first sensor module.

The process 800 may further include, for example, calibrating the first sensor module and the second sensor module such that the measured B-field magnitudes from the outputs of the first sensor module and the second sensor module are matched in one or more field directions.

The output signals from the first sensor module and second sensor module may, for example, be coupled through a filter circuit to normalize the output signals. The filter circuit may include a differential op-amp circuit. The filter circuit may include a high-pass filter circuit. The filter circuit may include a Kalman filter circuit.

The process 800 may further include, for example, providing an accelerometer output from an accelerometer device. The output may be further based at least in part on the accelerometer output. Alternately, or in addition, the method may further include providing a gyroscopic output from a gyroscopic device. The output may be further based in part on the gyroscopic output.

In some configurations, embodiments of a magnetic locator device include means for performing various functions as described herein. In one aspect, the aforementioned means may be a processor or processors and associated memory in which embodiments reside, and which are configured to perform the functions recited by the aforementioned means. The aforementioned means may be, for example, modules or apparatus residing in a printed circuit board module or modules, or other modules, to perform the functions and processes as are described herein. In another aspect, the aforementioned means may be a module or apparatus configured to perform the functions recited by the aforementioned means.

In one or more exemplary embodiments, the functions, methods and processes described may be implemented in whole or in part in hardware, software, firmware, or any combination thereof. If implemented in software, the functions may be stored on or encoded as one or more instructions or code on a computer-readable medium. Computer-readable media include computer storage media. Storage media may be any available media that can be accessed by a computer.

By way of example, and not limitation, such computer-readable media can include RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

It is understood that the specific order or hierarchy of steps or stages in the processes and methods disclosed are examples of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The various illustrative logical blocks, modules, processes, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps or stages of a method, process or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the spirit or scope of the disclosure. Thus, the disclosure is not intended to be limited to the aspects shown herein but is to be accorded the widest scope consistent with the principles and novel features disclosed herein. It is intended that the following claims and their equivalents define the scope of the disclosure.

We claim:

1. A magnetic utility locator, comprising:
an elongate housing element;
a first three-axis integrated circuit chip magnetic sensor disposed on or within the housing element at or near a lower end of the housing when the locator is positioned in a vertical orientation;
a second three-axis integrated circuit chip magnetic sensor positioned above the first three-axis magnetic sensor when the locator is positioned in a vertical orientation;
a printed circuit board (PCB) module positioned within the housing element including signal processing electronics coupled to an output of the first three-axis magnetic sensor chip and the output of the second three-axis magnetic sensor chip for subtracting corresponding output signals from one of the three-axis magnetic sensors from output signals of the other of the three-axis magnetic sensor to determine a magnetic field distortions in two or more dimensions caused by a hidden or buried conductive utility, where the magnetic fields result from currents flowing therein, and to determine information about the buried utility based at least in part on the determined magnetic field distortion;
a non-transitory memory for storing the determined information about the buried utility; and
a visual display element for providing a visual display of the determined information including a determined depth of the buried, a determined position of the buried utility, or both.

2. The locator of claim 1, wherein the housing element includes a tapered point at a bottom end when the locator is positioned in the vertical orientation.

3. The locator of claim 1, further comprising an accelerometer having an output signal coupled to the circuit board module, wherein the output is further based in part on an output signal from the accelerometer.

4. The locator of claim 1, wherein the three-axis magnetic sensors integrated circuit chips are anisoptropic magnetoresistive (AMR) sensor chips.

5. The locator of claim 1, further comprising a GPS receiver having an output signal coupled to the circuit board module, wherein the output is further based in part on an output signal from the GPS receiver.

6. The locator of claim 1, further comprising one or more additional three-axis magnetic sensors, for sensing magnetic fields in three axes at a point in space, each additional three-axis magnetic sensor having output signals coupled to the circuit board module, wherein the magnetic field distortion caused by the hidden or buried utility is further based on output signal(s) from the one or more additional three-axis magnetic sensors.

7. The locator of claim 1, wherein the signal processing electronics include a processor and an operatively coupled memory with programming for:
determining, at a first three-axis magnetic sensor disposed on or within the locator, a first three dimensional magnetic field value at the position of the three-axis magnetic sensor in space;
determining, at a second three-axis magnetic sensor disposed on or within the locator at a position different from the first three-axis magnetic sensor, a second three dimensional magnetic field value at the position of the second three-axis magnetic sensor in space;
subtracting, in an electronic circuit of the locator, the second three-axis magnetic field value from the first three-axis magnetic field value to determine a magnetic field distortion value;
determining, from the magnetic field distortion value, information about the hidden or buried utility;
storing the determined information about the hidden or buried utility in a non-transitory memory; and
providing an output with information about the hidden or buried utility based on the determined information.

8. The locator of claim 7, wherein the output is provided on a visual display.

9. The locator of claim 7, wherein the output is provided on an audible output device.

10. The locator of claim 7, wherein the output includes depth information about the hidden or buried utility.

11. The locator of claim 7, wherein the output includes positional information about the hidden or buried utility.

12. The locator of claim 1, wherein the magnetic field sensors are calibrated so that B-field magnitudes are matched in one or more magnetic field directions to normalize data generated by the magnetic field sensors in dynamic operation.

13. A magnetic utility locator, comprising:
an elongate housing element;
a first three-axis magnetic sensor disposed on or within the housing element at or near a lower end of the housing when the locator is positioned in a vertical orientation;

a second three-axis magnetic sensor positioned above the first three-axis magnetic sensor when the locator is positioned in a vertical orientation;

a printed circuit board (PCB) module positioned within the housing element including signal processing electronics coupled to an output of the first three-axis magnetic sensor and the output of the second three-axis magnetic sensor for subtracting corresponding output signals from one of the three-axis magnetic sensors from output signals of the other of the three-axis magnetic sensor to determine magnetic field distortions in two or more dimensions caused by a hidden or buried conductive utility, where the magnetic fields result from currents flowing therein, and to determine information about the buried utility based at least in part on the determined magnetic field distortion;

a non-transitory memory for storing the determined information about the buried utility; and a visual display element for providing a visual display of the determined information including a determined depth of the buried, a determined position of the buried utility, or both;

wherein the magnetic field sensor data is normalized using a differential op-amp circuit and applying a high pass or bandpass filter.

14. A magnetic utility locator, comprising:

an elongate housing element;

a first three-axis magnetic sensor disposed on or within the housing element at or near a lower end of the housing when the locator is positioned in a vertical orientation;

a second three-axis magnetic sensor positioned above the first three-axis magnetic sensor when the locator is positioned in a vertical orientation;

a printed circuit board (PCB) module positioned within the housing element including signal processing electronics coupled to an output of the first three-axis magnetic sensor and the output of the second three-axis magnetic sensor for subtracting corresponding output signals from one of the three-axis magnetic sensors from output signals of the other of the three-axis magnetic sensor to determine magnetic field distortions in two or more dimensions caused by a hidden or buried conductive utility, where the magnetic fields result from currents flowing therein, and to determine information about the buried utility based at least in part on the determined magnetic field distortion;

a non-transitory memory for storing the determined information about the buried utility;

a visual display element for providing a visual display of the determined information including a determined depth of the buried, a determined position of the buried utility, or both; and one or more additional three-axis magnetic sensors positioned at or near the lower end of the housing, wherein the determined information is based further on outputs from the two or more three-axis magnetic field sensors.

15. The locator of claim 1, wherein the housing comprises an elongate tubular structure and the three-axis integrated circuit chip magnetic sensors are positioned within the interior of the tube formed by the housing.

16. The locator of claim 13, wherein the housing comprises an elongate tubular structure and the three-axis magnetic sensors are positioned within the interior of the tube formed by the housing.

17. The locator of claim 14, wherein the housing comprises an elongate tubular structure and the three-axis magnetic sensors are positioned within the interior of the tube formed by the housing.

18. The locator of claim 1, further including a rotating connecting joint, wherein the visual display element is mechanically coupled to the rotating connecting joint to allow rotation of the visual display element to a user selected orientation.

19. The locator of claim 1, further including an audio output element for providing audible output corresponding to a sensed object.

* * * * *